United States Patent [19]
Johnson

[11] Patent Number: 6,045,653
[45] Date of Patent: Apr. 4, 2000

[54] GLUE DEPOSIT DEVICE FOR POWER PRINTED CIRCUIT BOARD

[75] Inventor: Joseph Herbert Johnson, Sunnyvale, Calif.

[73] Assignee: Xemod, Inc., Sunnyvale, Calif.

[21] Appl. No.: 09/122,456

[22] Filed: Jul. 24, 1998

[51] Int. Cl.[7] .................................................. B32B 31/00
[52] U.S. Cl. ............................................................. 156/292
[58] Field of Search ................................. 156/292, 556, 156/553

[56] References Cited

U.S. PATENT DOCUMENTS 5,615,735  4/1997  Yoshida et al. ...................... 257/722 X

*Primary Examiner*—Francis J. Lorin
*Attorney, Agent, or Firm*—Boris G. Tankhilevich

[57] ABSTRACT

The glue deposit device and method for automatically mounting a plurality of power devices to a heatsink using a plurality of spring clamps. The fully automated unconventional pick-and-place machine and method utilizing the glue deposit device for assembling the power printed circuit board using the spring clamps are also disclosed.

1 Claim, 5 Drawing Sheets

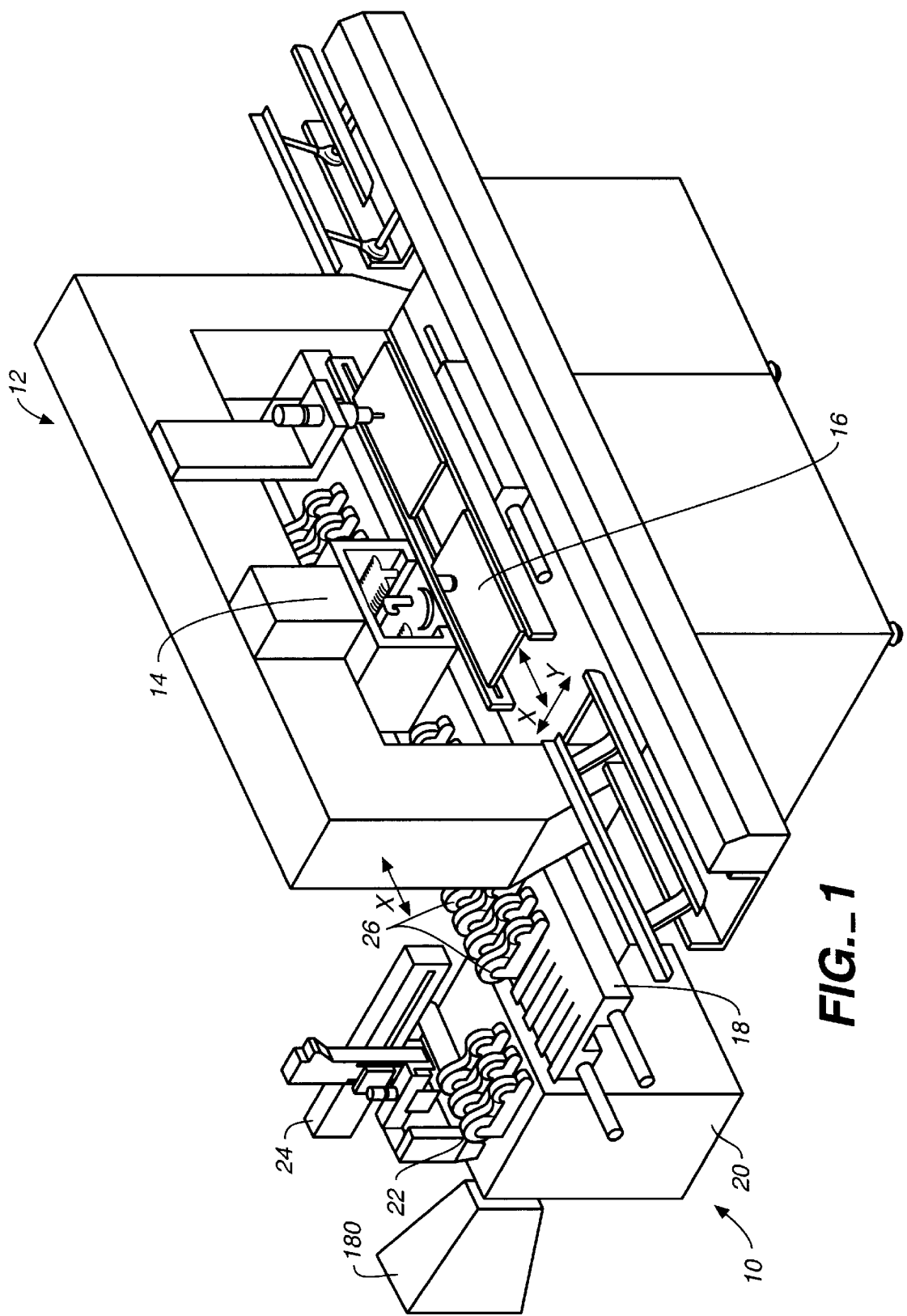
FIG._1

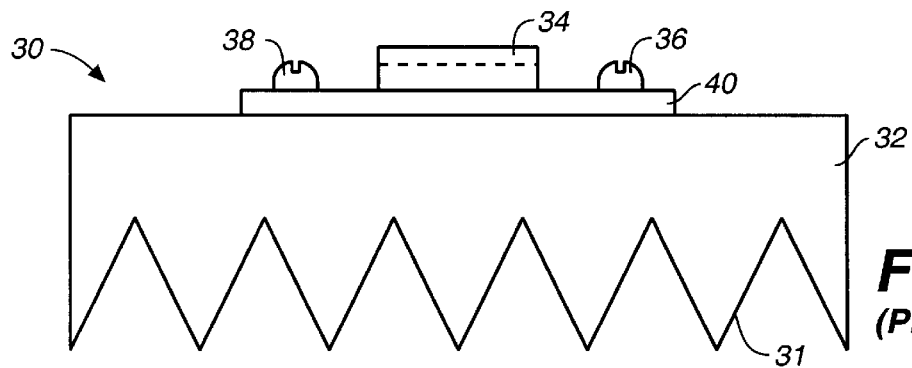
FIG._2A
(PRIOR ART)
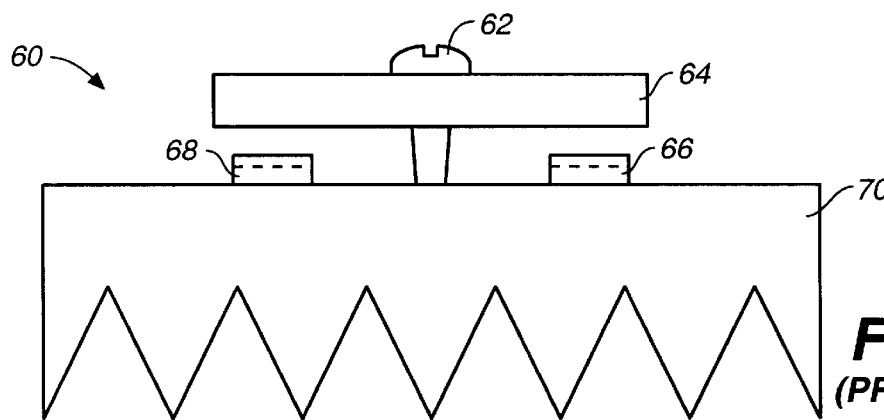
FIG._3
(PRIOR ART)
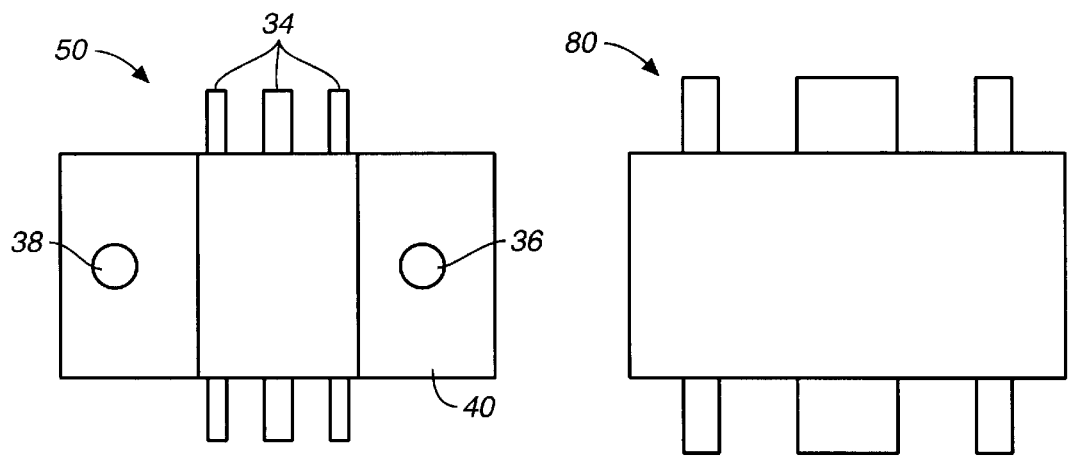
FIG._2B
(PRIOR ART)
FIG._4
(PRIOR ART)

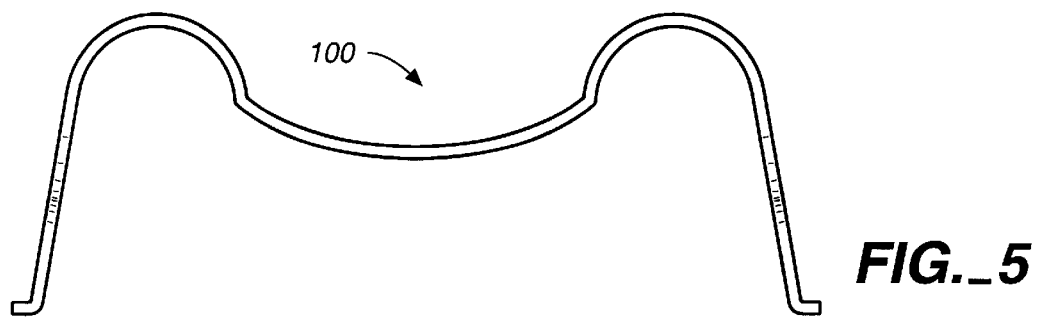
FIG._5
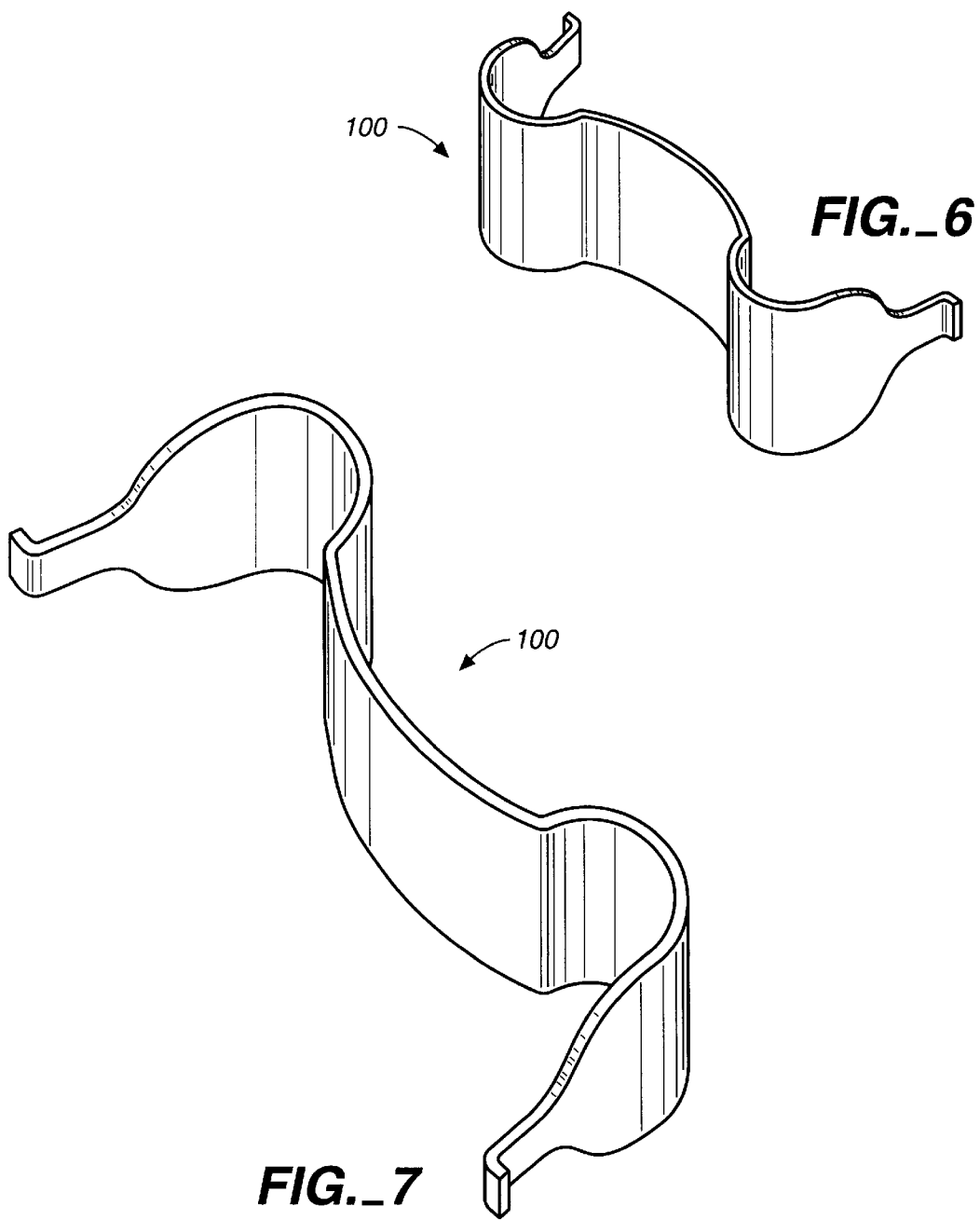
FIG._6
FIG._7

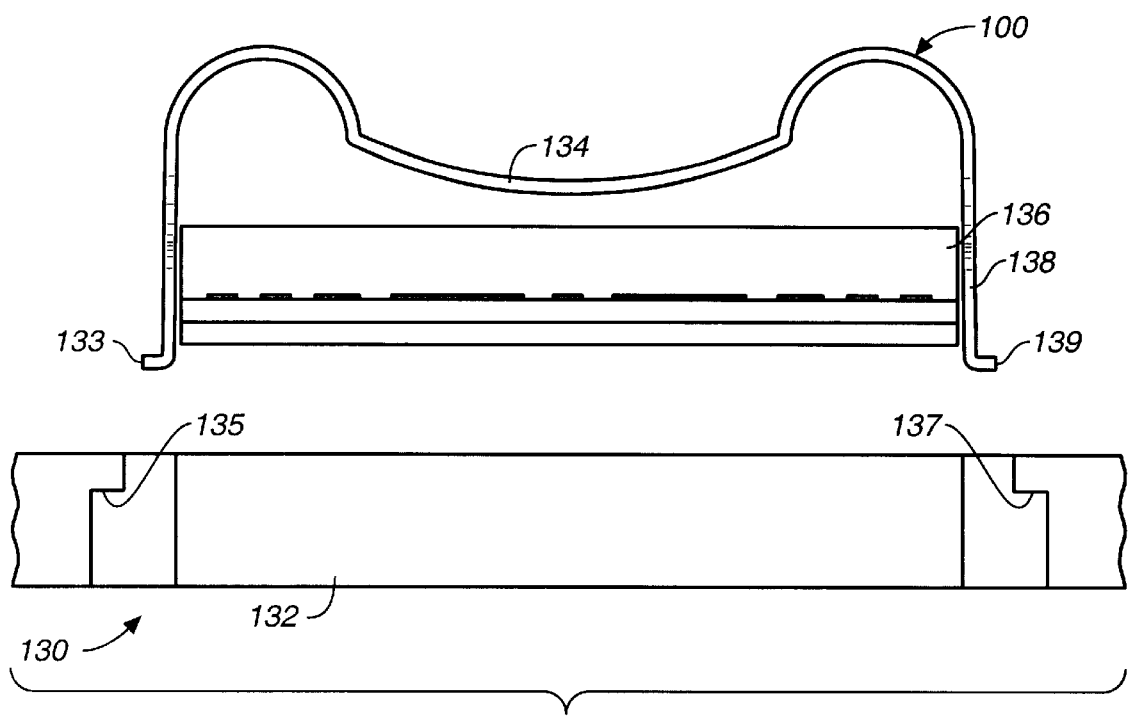
FIG._8
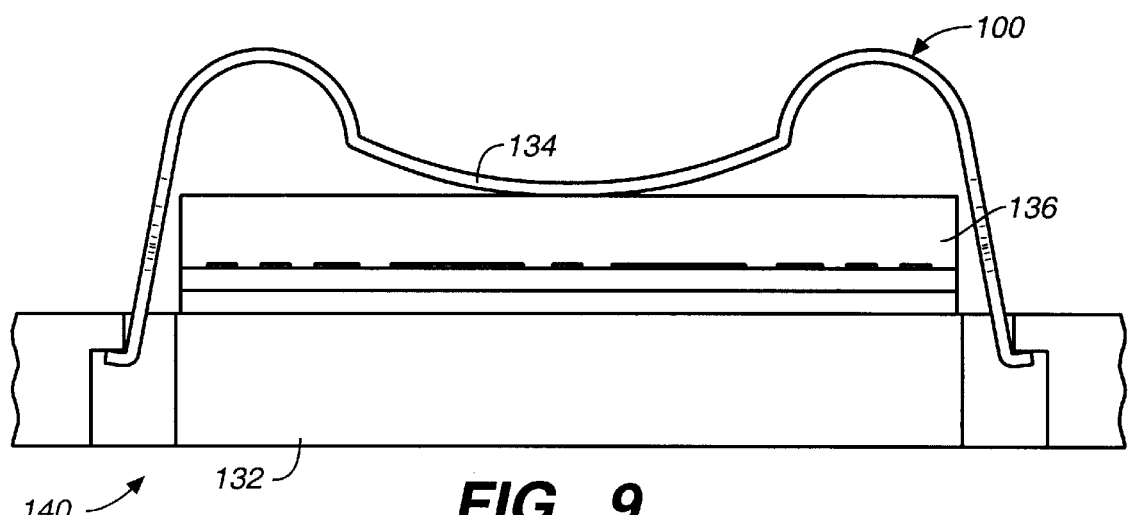
FIG._9

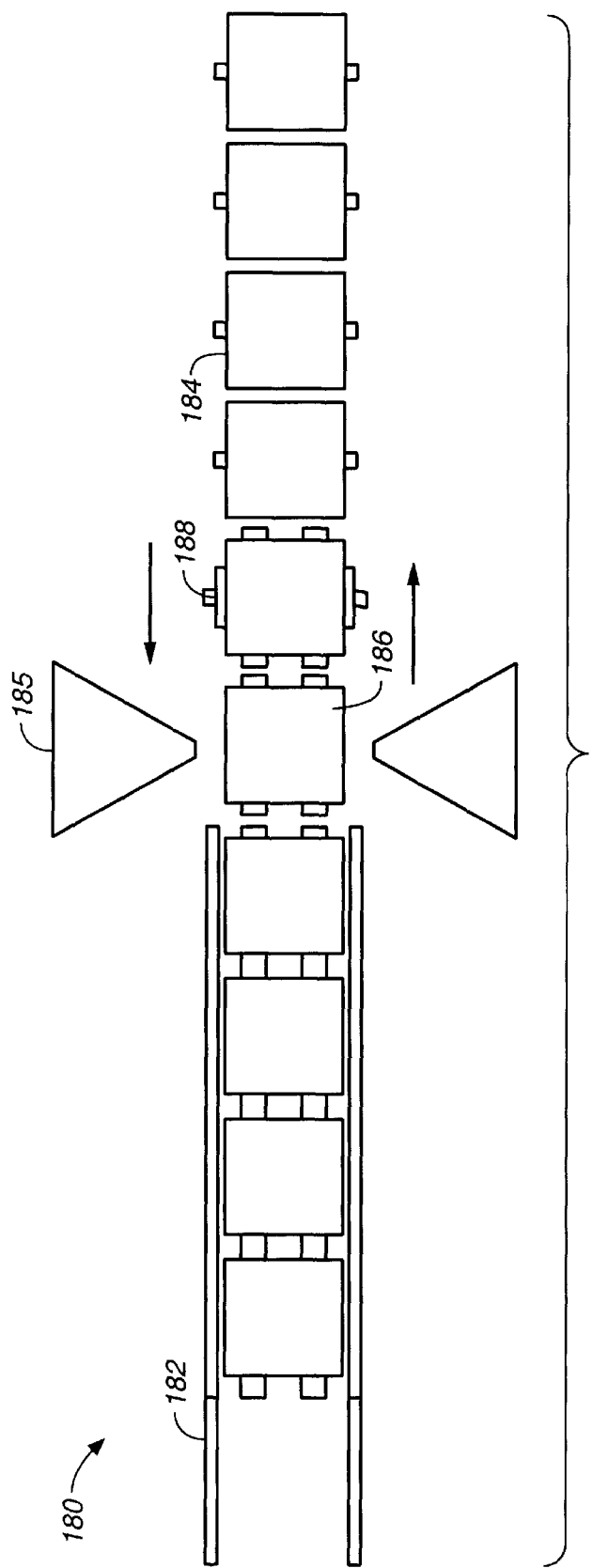
FIG._10

GLUE DEPOSIT DEVICE FOR POWER PRINTED CIRCUIT BOARD

This is a divisional application for the U.S. Patent application entitled "IMPROVED SURFACE MOUNTING TECHNOLOGY FOR POWER PRINTED CIRCUIT BOARDS", Ser. No. 08/714,416, filed on Sep. 16, 1996.

BACKGROUND

The present invention relates generally to an apparatus for automatically packaging power electronic parts on a power printed circuit board (PPCB). The packaging of the electronic parts on a PPCB involves the use of a plurality of part supply units for holding electronic parts. The electronic parts are picked up from the supply unit and mounted in predetermined locations of the PPCB. For this purpose, the electronic part automatic packaging apparatus incorporates a function to automatically replace the part supply unit.

A conventional automated pick-and-place machine (PPM) for assembling a printed circuit board (PCB) includes several major elements. The PPM machine includes a housing portion for housing a plurality of electronic component dispensing mechanisms, and a packaging portion in which selected component dispensing units are placed and from which components are individually picked by a mounting device and mounted on the PCB in predetermined locations. Each of the component dispensing units is provided with a data storage unit for reading and writing type and quantity information concerning the respective electronic components.

The conventional PPM apparatus further includes a production manager that determines the types and quantities of electronic components needed for production of a variety of PCB and generates a production schedule depending upon the type of board to be assembled. The conventional PPM machine also comprises a control device that controls the operation of the mounting device, read/write device, a transfer device for controlling assembly of the PCB in accordance with the production manager, and a robotic conveying device for controlling the transfer of component dispensing device from a storage unit to the assembly device. See for instance U.S. Pat. No. 5,456,001 that discloses the apparatus for automatically packaging electronic parts on PCB.

A power printing circuit board (PPCB) includes power transistors and/or power integrated circuits (IC). A PPCB also includes a base plate or a heatsink that is attached to the PPCB to provide for the removal of the heat output from a power device. The power printing circuit boards (PPCB) are conventionally assembled using bolts to attach the power devices. However, the usage of bolts involves a manual operation that complicates the operation of a conventional pick-and-place machine (PPM). In the prior art the soldering of he power printing circuit boards is also done manually after the bolting operation is performed.

What is needed is a glue deposit device for automatically inserting at least one spring clamp into a power device and an unconventional pick-and-place machine (UPPM) that includes the glue deposit device for automatically mounting power devices on a PPCB.

SUMMARY

The present invention is unique and novel because it discloses a glue deposit device for automatically inserting at least one spring clamp into a power device and an unconventional pick-and-place machine (UPPM) that includes the glue deposit device.

One aspect of the present invention is directed to a glue deposit device comprising: (a) at least two conveyor channels moving in opposite directions towards each other; and (b) a glue container. The first conveyor channel carries a plurality of power devices in one direction and the second conveyor channel carries a plurality of clamps in the direction opposite to the direction of the first conveyer. The first (leading) power device moves under the first (leading) spring clamp at the meeting point. The glue container is placed above the meeting point. The glue is deposited from the glue container on the edge of the leading power device. The leading clamp legs are compressed until the leading clamp touches the body of the leading power device while the glue hardens.

Another aspect of the present invention is directed to an unconventional pick-and-place machine (UPPM) for automatically mounting electronic parts on a power printed circuit board (PPCB) including power devices.

In one embodiment, the UPPM machine comprises: (a) a glue deposit device for gluing each power device to at least one spring clamp to hold it in place; (b) a housing device for housing a plurality of part supply units, wherein at least one part supply unit holds at least one power device glued to at least one clamp; (c) a transfer device for transferring respective part supply units from a portion of the housing device to a mounting board; (d) a packaging device for removing respective electronic parts from respective part supply units on the mounting board and mounting the electronic parts at predetermined locations on the power printed circuit board (PPCB); wherein each power device is inserted automatically by breaking the glue and by pushing the spring clamp until it locks into place; (e) an information storage device provided in respective part supply units in which information concerning the type and quantity of the electronic parts is stored and can be read from and written to; and (f) a control device for controlling the glue deposit device, the housing device, the transfer device, the packaging device, and the information storage device in accordance with the production schedule output.

One more aspect of the present invention is directed to a method for automatically inserting a spring clamp into a power device.

In one embodiment, the method comprises the following steps: (a) moving at least two conveyor channels in opposite directions towards each other; wherein the first conveyor channel carries a plurality of power devices in one direction; and wherein the second conveyor channel carries a plurality of clamps in the direction opposite to the direction of the first conveyer; (b) placing the first (leading) power device under the first (leading) spring clamp at the meeting point; (c) depositing the glue from a glue container on the edge of the leading power device; (d) compressing the leading clamp legs are until the leading clamp touches the body of the leading power device while the glue hardens; and (e) repeating the steps (b–d) for the next pair of the leading power device and the leading clamp.

Yet, one more aspect of the present invention is directed to a method for automatically mounting electronic parts on a power printed circuit board (PPCB) including at least one power device and a heatsink by using an unconventional pick-and-place machine (UPPM).

In one embodiment, the method comprises the following steps: (a) gluing each power device to at least one spring clamp to hold it in place by using a glue deposit device; (b) housing a plurality of part supply units each for holding a plurality of electronic parts in a suppliable manner; wherein at least one part supply unit holds at least one power device glued to the spring clamp; (c) transferring respective part supply units from a portion of the housing device to a mounting board; (d) removing respective electronic parts from respective part supply units on the mounting board and mounting the electronic parts at predetermined locations on the power printed circuit board (PPCB); (e) releasing at least one spring clamp in automatic fashion by breaking up the glue; wherein each power device is inserted automatically by pushing one spring clamp until it locks into place; (f) storing and reading information concerning the type and quantity of the electronic parts using an information storage device; and (g) controlling the housing device, the transfer device, the packaging device, the glue deposit device, and the information storage device in accordance with the production schedule output by using a control device.

BRIEF DESCRIPTION OF THE DRAWINGS

FIG. 1 depicts a conventional pick-and-place machine.

FIG. 2A is a sideview that illustrates the current practice of mounting a power device on a power printed circuit board (PPCB) using flange clamps with bolts.

FIG. 2B is a top view of a typical flange clamp.

FIG. 3 is a sideview that depicts the current practice of mounting a power device on a power printed circuit board (PPCB) using a flangeless clamp with a bolt.

FIG. 4 illustrates a top view of a typical flangeless clamp.

FIG. 5 depicts a spring clamp without bolt for mounting a power device on a power printing circuit board (PPCB).

FIG. 6 is a three dimensional drawing of a spring clamp of FIG. 5.

FIG. 7 illustrates a three dimensional drawing of a spring clamp of FIG. 5.

FIG. 8 depicts a spring clamp and a package prior to mounting on heatsink.

FIG. 9 shows clamp and package mounted on heatsink.

FIG. 10 illustrates a glue deposit device.

FULL DESCRIPTION OF THE PREFERRED EMBODIMENTS

FIG. 1 illustrates a conventional prior art electronic part automatic packaging apparatus 10 equipped with the part supply units. This packaging apparatus is equipped with a packaging portion 12 supplied with printed circuit boards (PCBs) 16; a housing portion 20 for housing a plurality of part supply units 22; and a transfer portion 24 for transferring the part supply unit 26 to the packaging portion from the housing portion 20. The packaging portion 12 includes a packaging device 14 for packaging the electronic parts on the PCB 16 while moving in directions X and Y; and a mounting board 18, reciprocating in the X direction, on which the plurality of part supply units 26 are arranged. The PCBs 16 are sequentially fed to the packaging device 14 in the direction X. The packaging device picks up the electronic parts out of the part supply unit 26 on the mounting board 18 and packages them in predetermined locations of the PCB 16. The transfer portion 24 transfers the part supply units 22 stocked in the housing portion 20 onto the mounting board 18 and thereafter mounts these units on the mounting board 18.

The operations of the respective portions in this packaging apparatus are controlled by an unillustrated centralized control device. The number of parts residing in the part supply unit 26 is inputted to the centralized control device. At the same time, the centralized control device includes a notifying device (not shown) for giving an advance notice when the residual quantity reaches a set value after being counted by this counter. The given above description of the prior art conventional pick-and-place machine (PPM) is disclosed in the U.S. Pat. No. 5,456,001 that is incorporated by reference herein. The conventional pick-and-place assembly machines are manufactured by OK Industries, New York, N.Y.

A typical power printed circuit board (PPCB) includes power devices like RF power transistors and/or power integrated circuits (power IC). A typical PPCB also includes a heatsink (32 of FIG. 2A and 70 of FIG. 3) to provide the means for heat output from a power device that generates lots of heat energy during its operation. The heatsink can include a simple mounting plate or a more complex structure for the dissipation of heat. For instance, a plurality of fins in aluminum extrusion can comprise a heatsink (see 31 of FIG. 2A).

The current practice of mounting a power device on a power printed circuit board (PPCB) is to bolt the power device down using a flange clamp as shown in FIGS. 2A and 2B, or using a flangeless clamp as depicted in FIGS. 3 and 4. In both cases bolts are used to attach a power device to the heatsink of the power printed circuit board (PPCB). Thus, the current practice requires the manual operation of screwing the bolts to the power device and to the heatsink of the power printed circuit board (PPCB). This complicates the operation of the conventional pick-and-place machine (PPM) of FIG. 1 because it makes the operation of the conventional PPM less than full automatic. This also leads to a manual soldering operation because the less than fully automatic PPM can not support the automatic soldering operation.

The present invention discloses a fully automated unconventional pick-and-place machine (UPPM) for assembling the power printed circuit boards (PPCB). The idea is to use a special mounting device like a spring clamp 100 as depicted in FIG. 5 (see also the three dimensional drawings of the spring clamp in FIGS. 6 and 7) that does not require the usage of bolt in order to attach the spring clamp to the heatsink. Indeed, as depicted in FIGS. 8 and 9, the spring clamp 100 simply clips into holes 135 and 137 attaching the power device 136 to the heatsink 132. The foot 133 (139) of the spring clamp 134 is small enough to be pushed through the hole 135 (137). It is then allowed to spring out and lock itself down while pressing down on top of the power device 136.

The usage of clamp (100) provides for a more consistent assembly process. Indeed, the design of a clamp itself insures that the certain amount of mechanical pressure will be applied to a power device when the clamp is locked. On the other hand, different bolts provide different amounts of mechanical pressure on different power devices depending on what amount of mechanical torque was developed during the manual operation of bolting the particular power device to the heatsink.

The spring clamp of FIGS. 8 and 9 can comprise a beryllium copper clamp, or a spring steel clamp.

After the power device is attached to heatsink its leads should be soldered to the printed circuit board to make an electrical connection in the same soldering process that is used to connect all of the other surface mount technology (SMT) components on the PCB.

The reflow soldering method can be used for soldering the leads of the power device 136 to the power printed circuit board (PPCB). The reflow soldering is the predominant soldering method for surface mount technology assemblies. The reflow soldering technique provides an opportunity to handle assemblies with components on both sides, some with surface mount mixed with conventional through-hole components. The reflow soldering is a fixed mass-soldering operation. Several methods exist to effectively reflow solder paste. The two major mass reflow methods use the vapor phase condensation and infrared radiation for heating. For the full reference see the "Step 6, Reflow Soldering" by Charles L. Hutchins in the Surface Mount Technology (SMT magazine in 1994. This article is incorporated by reference herein.

The wave soldering method can be also used for soldering the leads of the power device 136 to the power printed circuit board (PPCB). The wave soldering method is an additive process in which the leads should reach out to make contact with liquid wave solder, pull the solder back into the lead area, and form the final solder filler shape and size. Parts should be oriented to optimize solder flow and pads should be accessible to contact in order to help break the surface tension. For the complete description of the wave soldering operation see the article "Step 7, Wave soldering" by John Maxwell in the Surface Mount Technology magazine, 1994. This article is incorporated by reference herein.

The automated pick-and-place machine of FIG. 1 can be modified for automatic assembling of the power printed circuit boards (PPCB). To accomplish this function the conventional pick-and-place machine of FIG. 1 should additionally include an element that would allow to place the described above spring clamps in automatic fashion.

In one embodiment, the unconventional pick-and-place machine (UPPM) additionally comprises a glue deposit device (see 180 of FIG. 1 and 180 of FIG. 10) for gluing each power device to at least one spring clamp to hold it in place, wherein each power device is inserted automatically by breaking the glue and by pushing the spring clamp lock into place.

The glue deposit device (180 of FIG. 10) comprises two conveyor channels ((182) and (184)) moving in opposite directions towards each other and a glue deposit device (185). The glue is deposited from the glue container (185) on the edge of the leading power device (186) and then the power device moves under the leading clamp (188). The leading clamp is placed over the leading power device. The leading clamp legs are compressed until it touches the body of the power device while the glue hardens. The glue can comprise cyanoacrylate manufactured by Pager Technology, Rancho Cucamonga, Calif. 91730.

The method of automatically releasing the clamps using the glue deposit device (180 of FIG. 10) comprises the following steps of: (a) moving a plurality of power devices using the first conveyor channel in one direction; (b) moving a plurality of clamps using the second conveyor channel in another direction towards the first conveyor channel; (c) placing the leading power device under the leading clamp; (d) depositing the glue from the glue deposit device on the edge of the leading power device; (e) compressing the leading clamp legs until it touches the body of the leading power device while the glue hardens; (f) repeating the steps (c–e) for the next pair of the leading power device and the leading clamp.

Thus, the unconventional pick-and-place machine (UPPM) additionally comprises the glue deposit device (180 of FIG. 10).

The UPPM machine for automatically mounting electronic parts on a power printed circuit board (PPCB) including power devices comprises: (a) a glue deposit device for gluing each power device to at least one spring clamp to hold it in place; (b) a housing device for housing a plurality of part supply units including at least one power device glued to at least one spring clamp; (c) a transfer device for transferring respective part supply units from a portion of the housing device to a mounting board; (d) a packaging device for removing respective electronic parts from respective part supply units on the mounting board and for mounting the electronic parts at predetermined locations on the power printed circuit board (PPCB); wherein each power device is inserted automatically by breaking the glue and by pushing the spring clamp until it locks into place; (e) an information storage device provided in respective part supply units in which information concerning the type and quantity of the electronic parts is stored and can be read from and written to; and (f) a control device for controlling the glue deposit device, the housing device, the transfer device, the packaging device, and the information storage device in accordance with the production schedule output.

If the conventional pick-and-place machine (FIG. 1) is used for assembling the power printed circuit board (PPCB), the power devices are attached to the heatsink using bolts and screws. This is a manual operation. In the prior art conventional PPM, the soldering of leads of the power device to the circuit board is also performed manually.

If the unconventional pick-and-place machine (UPPM) of the present invention (10 of FIG. 1) is used for assembling the power printed circuit board the step of soldering should be performed after the power device is attached to heatsink using the spring clamp. The soldering step is performed using a soldering machine. Thus, the UPPM is a fully automated machine and its operation is as simple as an operation of the conventional PPM used for assembling the conventional printed circuit boards.

In one embodiment, the method for automatically mounting electronic parts on a power printed circuit board (PPCB) including power devices and a heatsink utilizes the described above unconventional-and-place machine (UPPM) that includes a glue deposit device. The method comprises the following steps: (a) gluing at least one spring clamp to each power device to hold it in place; (b) housing a plurality of part supply units including power devices glued to spring clamps; (c) transferring part supply units from the housing device to a mounting board; (d) removing electronic parts from the mounting board and mounting them at predetermined locations on the power printed circuit board (PPCB); (e) releasing at least one spring clamp in automatic fashion by breaking up the glue; wherein each power device is inserted automatically by pushing at least one spring clamp until the clamp locks into place; and wherein each spring clamp consistently presses one power device to the heatsink; (f) storing and reading information concerning the type and quantity of the electronic parts using an information storage device; and (g) controlling the housing device, the transfer device, the packaging device, the glue deposit device, and the information storage device in accordance with the production schedule output by using a control device.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A method for automatically inserting a spring clamp into a power device; said method comprises the steps of:
   (a) moving at least two conveyor channels in opposite directions towards each other; wherein said first conveyor channel carries a plurality of power devices in one direction; and wherein said second conveyor channel carries a plurality of clamps in the direction opposite to the direction of the first conveyer;
   (b) placing a first (leading) power device under a first (leading) spring clamp at the meeting point;
   (c) depositing the glue from a glue container on the edge of said leading power device;
   (d) compressing said leading clamp legs until said leading clamp touches the body of said leading power device while the glue hardens; and
   (e) repeating the steps (b–d) for the next pair of said leading power device and said leading spring clamp;
   whereby each said spring clamp is automatically inserted into one said power device without applying heat.

* * * * *